(12) United States Patent
Takahashi et al.

(10) Patent No.: US 7,364,460 B2
(45) Date of Patent: Apr. 29, 2008

(54) FIXING MEMBER AND FIXING STRUCTURE

(75) Inventors: Shinji Takahashi, Aichi-ken (JP);
Yoshiaki Kato, Aichi-ken (JP);
Harehide Sasaki, Aichi-ken (JP);
Kazuharu Yoshimatsu, Aichi-ken (JP);
Katsumasa Matsuoka, Aichi-ken (JP);
Masato Minakata, Toyota (JP);
Hiroshi Kobayashi, Toyota (JP)

(73) Assignee: Kabushiki Kaisha Tokai-Rika-Denki-Seisakusho, Aichi-ken (JP)

( * ) Notice: Subject to any disclaimer, the term of this patent is extended or adjusted under 35 U.S.C. 154(b) by 0 days.

(21) Appl. No.: 11/623,039

(22) Filed: Jan. 12, 2007

(65) Prior Publication Data
US 2007/0173134 A1    Jul. 26, 2007

(30) Foreign Application Priority Data
Jan. 23, 2006    (JP) .............................. 2006-013923

(51) Int. Cl.
*H01R 13/60* (2006.01)
(52) U.S. Cl. ........................................ 439/567; 439/876
(58) Field of Classification Search ................. 439/83, 439/567, 570, 876
See application file for complete search history.

(56) References Cited

U.S. PATENT DOCUMENTS

| | | | |
|---|---|---|---|
| 5,150,086 A * | 9/1992 | Ito ............................ 333/182 |
| 5,186,634 A * | 2/1993 | Thompson .................... 439/82 |
| 6,095,872 A | 8/2000 | Lang et al. |
| 6,183,294 B1 * | 2/2001 | Fan et al. .................... 439/567 |
| 6,638,106 B1 * | 10/2003 | Wu ............................ 439/567 |
| 7,052,317 B2 * | 5/2006 | Hara et al. ................. 439/567 |

FOREIGN PATENT DOCUMENTS

JP    05159819 A *    6/1993    ................. 439/876

* cited by examiner

*Primary Examiner*—Thanh-Tam Le
(74) *Attorney, Agent, or Firm*—Roberts, Mlotkowski & Hobbes; Thomas W. Cole

(57) ABSTRACT

The fixing member of the present invention can be mounted to a fixed member that is fixed to a printed circuit board and that is used for fixing the fixed member to the printed circuit board, the fixing member including: a mounting member main body fixed to the fixed member; male connector portions having at tip ends thereof lug portions that are engaged with an opening edge of an insertion opening in the printed circuit board when inserted into the inserting opening; and contact portions that contact with a soldering land formed at the printed circuit board and are joined to the soldering land by soldering when the lug portions are engaged with the opening edge, the contact portions being formed at the mounting portion main body and the male connector portions extend arm-shaped from the mounting portion main body or from the contact portions.

8 Claims, 7 Drawing Sheets

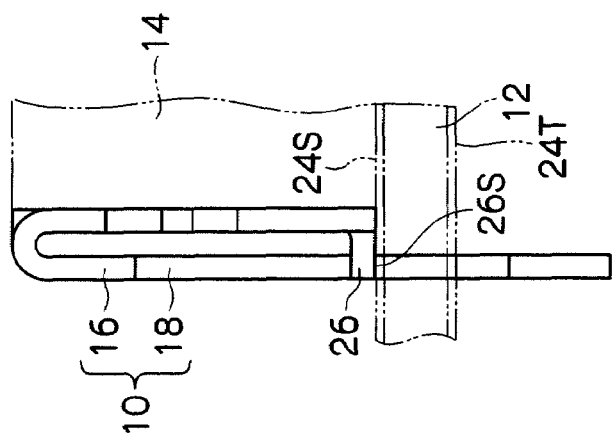
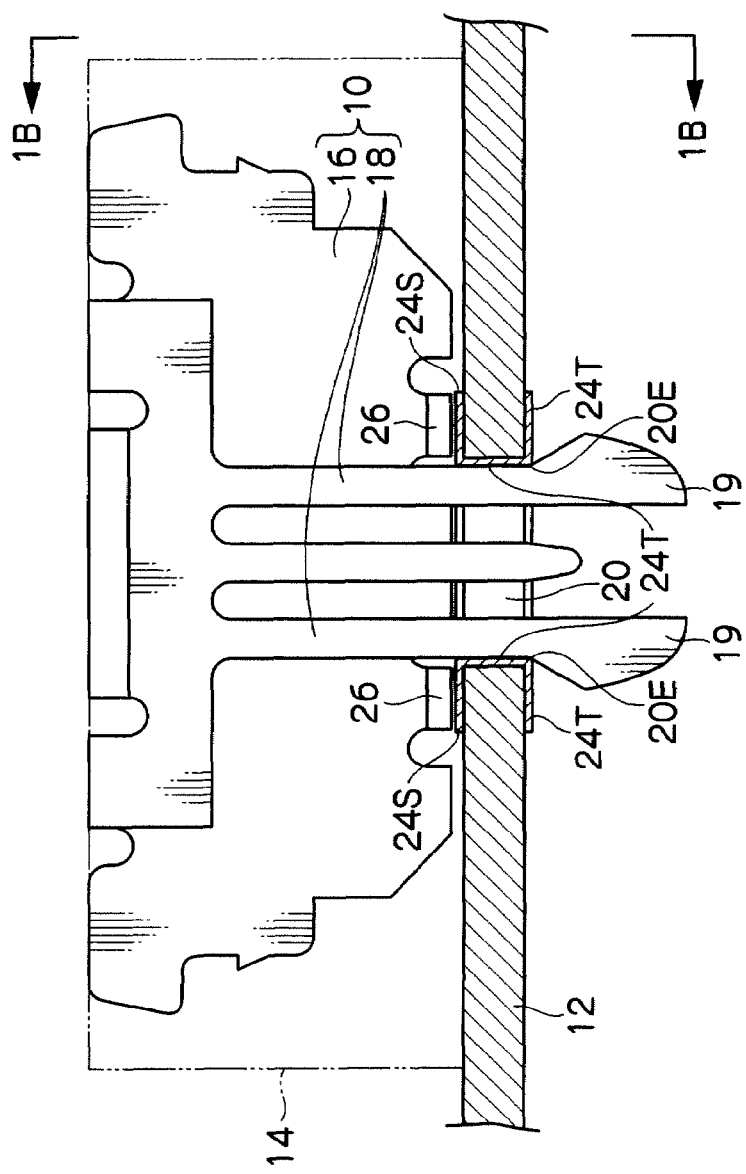

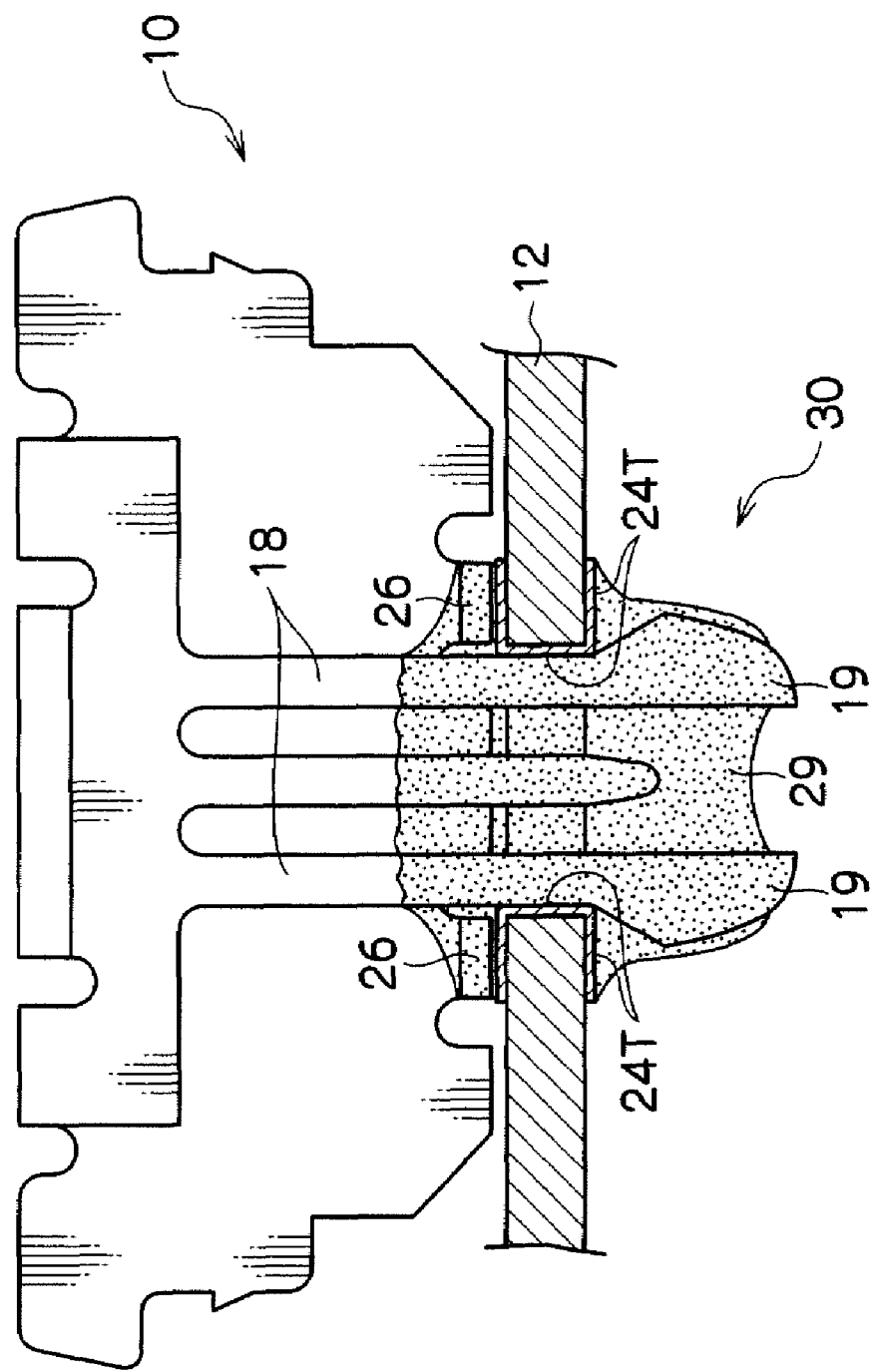

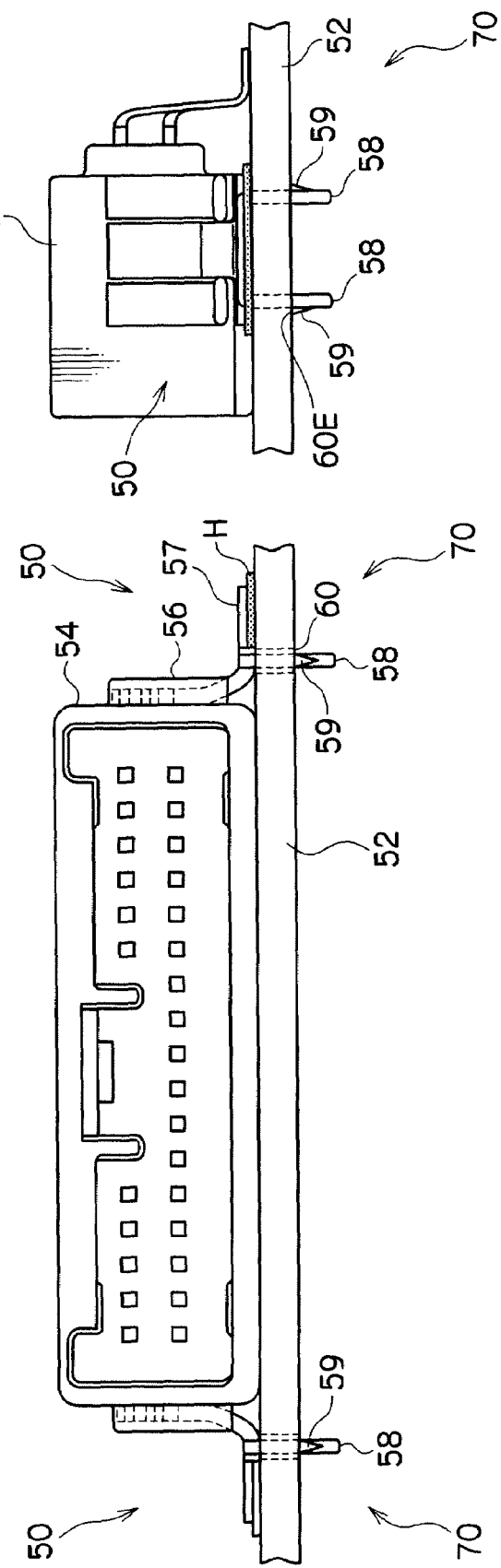

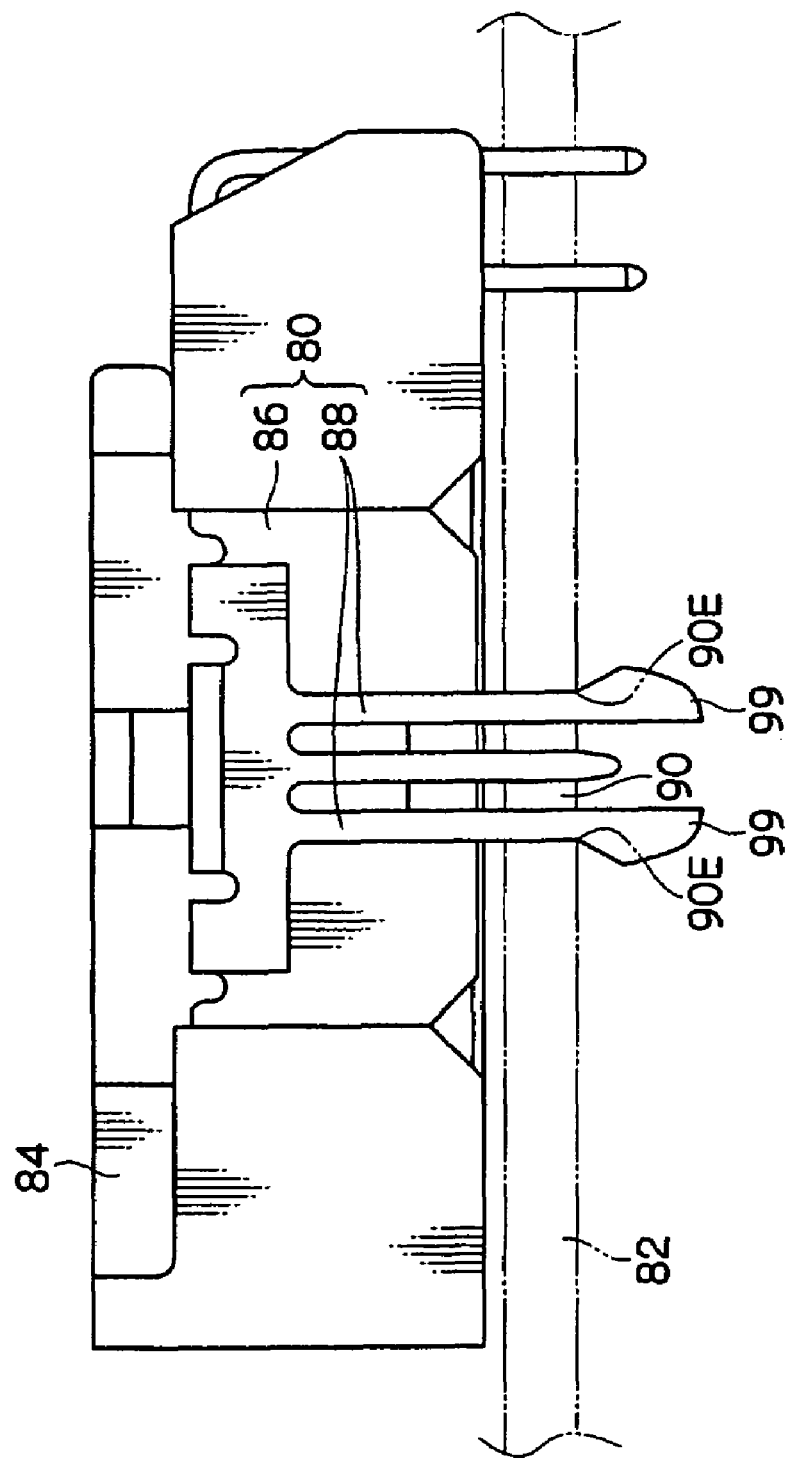

FIXING MEMBER AND FIXING STRUCTURE

CROSS-REFERENCE TO RELATED APPLICATIONS

This application claims priority under 35 USC 119 from Japanese patent Application No. 2006-013923, the disclosure of which is incorporated by reference herein.

BACKGROUND OF THE INVENTION

1. Field of the Invention

The present invention relates to a fixing member used for fixing a fixed member to a printed circuit board and also relates to a fixing structure.

2. Description of the Related Art

A large number of electronic components are mounted on a printed circuit board (PCB). The electronic components need to be fixed to the printed circuit board and, therefore, a fixing member is typically mounted to an electronic component and the fixing member is fixed to the printed circuit board by soldering (for example, see Japanese Utility Model Application Laid-Open (JP-U) Nos. 5-15347 and 63-117064, and Japanese Patent Application Laid-Open (JP-A) Nos. 7-235351, 8-315878, 11-273797, 2000-3746 and 2003-243822). Prior art will be described below by way of example.

As shown in FIG. 8, conventionally, to fix an electronic component 84 to a printed circuit board 82, a fixing member 80 is mounted to the electronic component 84 and the fixing member 80 is fixed to the printed circuit board 82 by soldering.

The fixing member 80 includes male connector portions 88 that are to be inserted into an insertion opening 90 in the printed circuit board 82 and protrude arm-shaped from a fixing member main body 86. Lug portions 99 that are to be engaged with an opening edge 90E when inserted into the opening 90 are formed at the tip ends of the male connector portions 88. After the male connector portions 88 are inserted into the opening 90 and the lug portions 99 are engaged with the opening edge 90E, the lug portions 99 are joined by soldering to the printed circuit board 82 so as to fix the fixing member 80.

However, since the male connector portions 88 are arm-shaped and fixed at the lug portions 99 to the printed circuit board 82 at tip ends of the male connector portions 88, even though the connector does not become detached from the printed circuit board 82, the male connector portions 88 can be bent. As a result, due to this bending of the male connector portions 88, the fixing member main body 86 and the male connector portions 88 move in respective directions and problems are caused.

SUMMARY OF THE INVENTION

The present invention has been made to solve the above-described problems, and a first aspect of the invention provides a fixing member that can be mounted to a fixed member to be fixed to a printed circuit board and that is used for fixing the fixed member to the printed circuit board, the fixing member comprising: a mounting member main body fixed to the fixed member; male connector portions having at their tip ends lug portions engaged with an edge of an insertion opening in the printed circuit board when inserted into the insertion opening; and contact portions which come in contact with a soldering land formed at the printed circuit board and are joined to the soldering land by soldering when the lug portions are engaged with the opening edge, wherein the contact portions are formed at the mounting portion main body and the male connector portions extend arm-shaped from the mounting portion main body or from the contact portions.

A second aspect of the invention to achieve the above object provides a fixing member according to the first aspect, wherein the contact portions are formed at one end of the fixing member main body and the male connector portions are formed at the other end of the fixing member main body so as to fold back toward the contact portions.

A third aspect of the invention to achieve the above object provides the fixing member according to the first aspect, wherein the contact portions are formed at one end of the fixing member main body and the male connector portions are formed at the contact portions and in the vicinity of the fixing member main body.

In the fixing members according to these aspects, both the lug portions and contact portions are joined to the printed circuit board by soldering and therefore bending of the male connector portions after soldering is suppressed even though the male connectors are arm-shaped.

A fourth aspect of the invention to achieve the above object provides the fixing member according to the second aspect, wherein the fixing member main body, the male connector portions, and the contact portions are formed integrally.

A fifth aspect of the invention to achieve the above object provides the fixing member according to the third aspect, wherein the fixing member main body, the male connector portions, and the contact portions are formed integrally.

A sixth aspect of the invention to achieve the above object provides the fixing member according to the fourth aspect, wherein the contact portions are formed by bending one end of the mounting member main body and the male connector portions are formed by bending the other end of the mounting portion main body toward the contact portions.

A seventh aspect of the invention to achieve the above object provides the fixing member according to the fifth aspect, wherein the contact portions are formed by bending one end of the mounting member main body and the male connector portions extend in a direction that is not parallel to the contact portions.

In the fixing members according to these aspects, it is possible to obtain an extremely satisfactory state of contact between the soldering land and the contact portions. Moreover, it is easy to produce the structure of the fixing member and the time required to produce the fixing member can be reduced.

An eighth aspect of the invention to achieve the above object provides a fixing structure comprising: the fixing member according to any one of first to seventh aspects; a fixed member fixed to the fixing member main body provided at the fixing member; and the printed circuit board having an insertion opening and a soldering land, male connector portions of the fixing member being inserted into the insertion opening thereof and contact faces of the fixing member being joined to the soldering land thereof by soldering to thereby fix the fixed member.

In the fixing structure according to the above aspect, the fixing member is fixed to the printed circuit board so as to suppress bending thereof.

A ninth aspect of the invention to achieve the above object provides the fixing structure according to the eighth aspect, wherein the soldering land of the printed circuit board is a contact portion soldering land disposed around the insertion opening and the printed circuit board further includes a lug portion soldering land formed at a side from which the lug portions protrude, the lug portion soldering land being joined to the lug portions by soldering.

A tenth aspect of the invention to achieve the above object provides a fixing structure according to the ninth aspect, wherein the contact portion soldering land and the lug portion soldering land are formed integrally.

In the fixing structure according to these aspects, the solder applied to the lug portion soldering land flows also to the soldering land with which the contact faces are in contact. Therefore, the soldering operation becomes extremely easy and production time is reduced.

BRIEF DESCRIPTION OF THE DRAWINGS

FIGS. 1A and 1B are a front view of a fixing member according to a first embodiment and a side view in the direction of arrow 1B-1B, respectively.

FIG. 2 is a front view of a fixing structure in which the fixing member according to the first embodiment is used and an electronic component is fixed by soldering.

FIGS. 7A and 7B are a front view and a side view, respectively, showing a fixing structure in which an electronic component is fixed by soldering using a fixing member according to a second embodiment.

FIG. 8 is a front view showing an example of a conventional fixing member.

DESCRIPTION OF THE PREFERRED EMBODIMENTS

Figure 3:
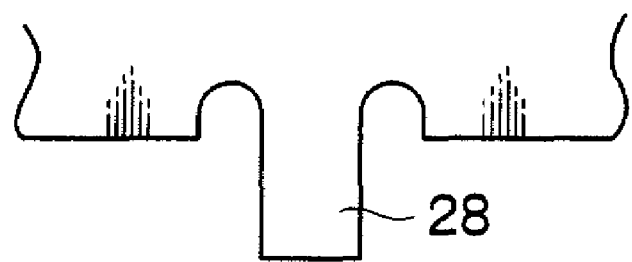
FIG. 3 is a partial plan view of a plate-shaped member cut out in order to form the fixing member according to the first embodiment.

Embodiments of the present invention will be described below. In the second and following embodiments, components similar to those described already will be provided with similar reference numerals and description thereof omitted.

1. First Embodiment

Firstly, the first embodiment will be described. As shown in FIGS. 1A, 1B and 2, a fixing member 10 of the present embodiment is a member that can be mounted to an electronic component 14 to be fixed to a printed circuit board 12.

The fixing member 10 includes a fixing member main body 16 and male connector portions 18 extending arm-shaped from the fixing member main body 16. The male connector portions 18 have formed at their tip ends lug portions 19 to be engaged with an opening edge 20E of an insertion opening 20 in the printed circuit board 12 when inserted into the insertion opening 20.

A contact portion soldering land 24S is formed around the insertion opening 20 of the printed circuit board 12 and the fixing member main body 16 has contact portions 26 that are formed by bending. The contact portions 26 have contact faces 26S which are formed on the contact portions 26 and come in contact with the contact portion soldering land 24S when the lug portions 19 are engaged with the opening edge 20E.

Moreover, a lug portion soldering land 24T that is to be joined to the lug portions 19 by soldering is formed on the side of the printed circuit board 12 from which the inserted lug portions 19 protrude. The contact portion soldering land 24S and the lug portion soldering land 24T are formed integrally.

Figure 4:
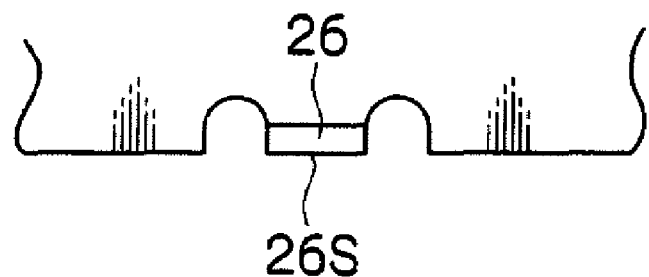
FIG. 4 is a partial plan view showing a cut-out portion of the plate-shaped member shown in FIG. 3 subjected to bending.

To produce the fixing member 10, a metal sheet is cut into a predetermined shape to form a plate-shaped member and the plate-shaped member is subjected to bending. Simultaneously, as shown in FIG. 3, a cut-out portion (extending portion) 28 for forming the contact portion 26 is formed and the cut-out portion 28 is subjected to bending through 90° so as to form the contact portion 26 (see FIG. 4). Thus, the fixing member 10 can be easily manufactured and the time required for producing the fixing member 10 can be reduced. Moreover, the contact faces 26S can be formed of metal sheet faces and a process of working the contact faces 26S into face shapes can be omitted.

In the present embodiment, the fixing member 10 is mounted to the electronic component 14, the male connector portions 18 of the fixing member 10 are inserted into the insertion opening 20, and the male connector portions 18 are engaged with the opening edge 20E at the lug portions 19. Then, soldering is carried out from a side from which the inserted lug portions 19 protrude. The contact portion soldering land 24S and the lug portion soldering land 24T are formed integrally. Therefore, solder applied to the lug portion soldering land 24T also flows to the contact portion soldering land 24S and, consequently, the lug portions 19 are joined to the lug portion soldering land 24T and the contact portions 26 are joined to the contact portion soldering land 24S. Therefore, the soldering operation becomes extremely easy and the production time can be reduced.

Dimensions of the contact portions 26, the lug portion soldering land 24T, and the contact portion soldering land 24S are determined in advance in consideration of the dimensions of the insertion opening 20 and the male connector portions 18 so that satisfactory solder joining can be achieved.

As described above, in the fixing member 10 according to the present embodiment, both the lug portions 19 and the contact portions 26 are joined to the printed circuit board 12 by soldering. Therefore, bending of the male connector portions 18 is restricted despite the male connector portions 18 having an arm shape.

Moreover, the fixing member 10 is mounted to the electronic component 14 and the contact faces 26S are joined to the contact portion soldering land 24S via the solder 29 so as to form a fixing structure 30 in which the electronic component 14 is fixed to the printed circuit board 12. Thus, it is possible to obtain the fixing structure 30 in which the fixing member 10 can be fixed to the printed circuit board 12 so as to suppress bending thereof.

Additionally, contact faces 26S of the contact portions 26 come in contact with the contact portion soldering land 24S and the surface contact thereof can make the contact of the contact portion soldering land 24S with the contact portions 26 extremely satisfactory.

Figure 5:
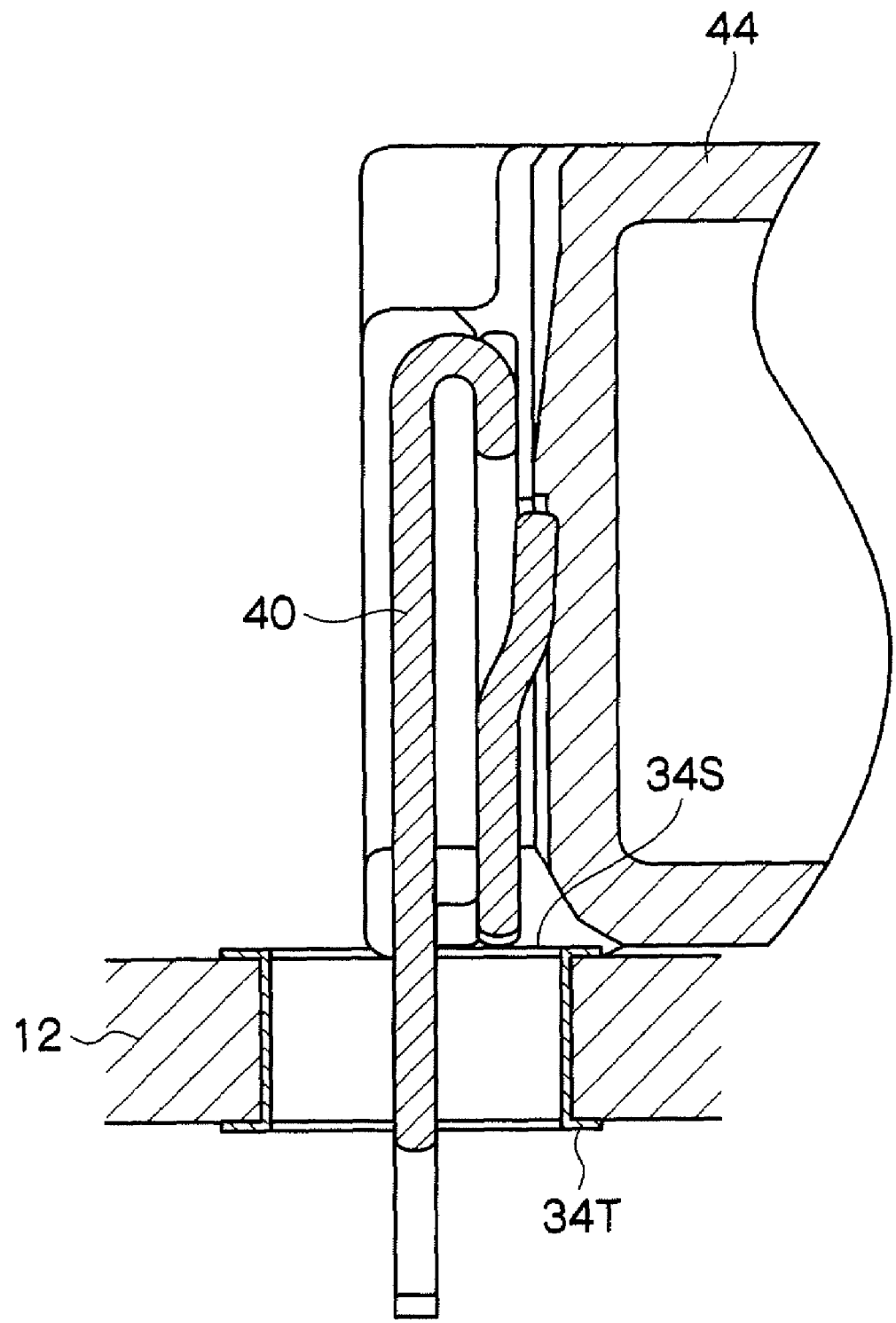
FIG. 5 shows a state in which soldering has not been carried out in a variation of the first embodiment.
Figure 6:
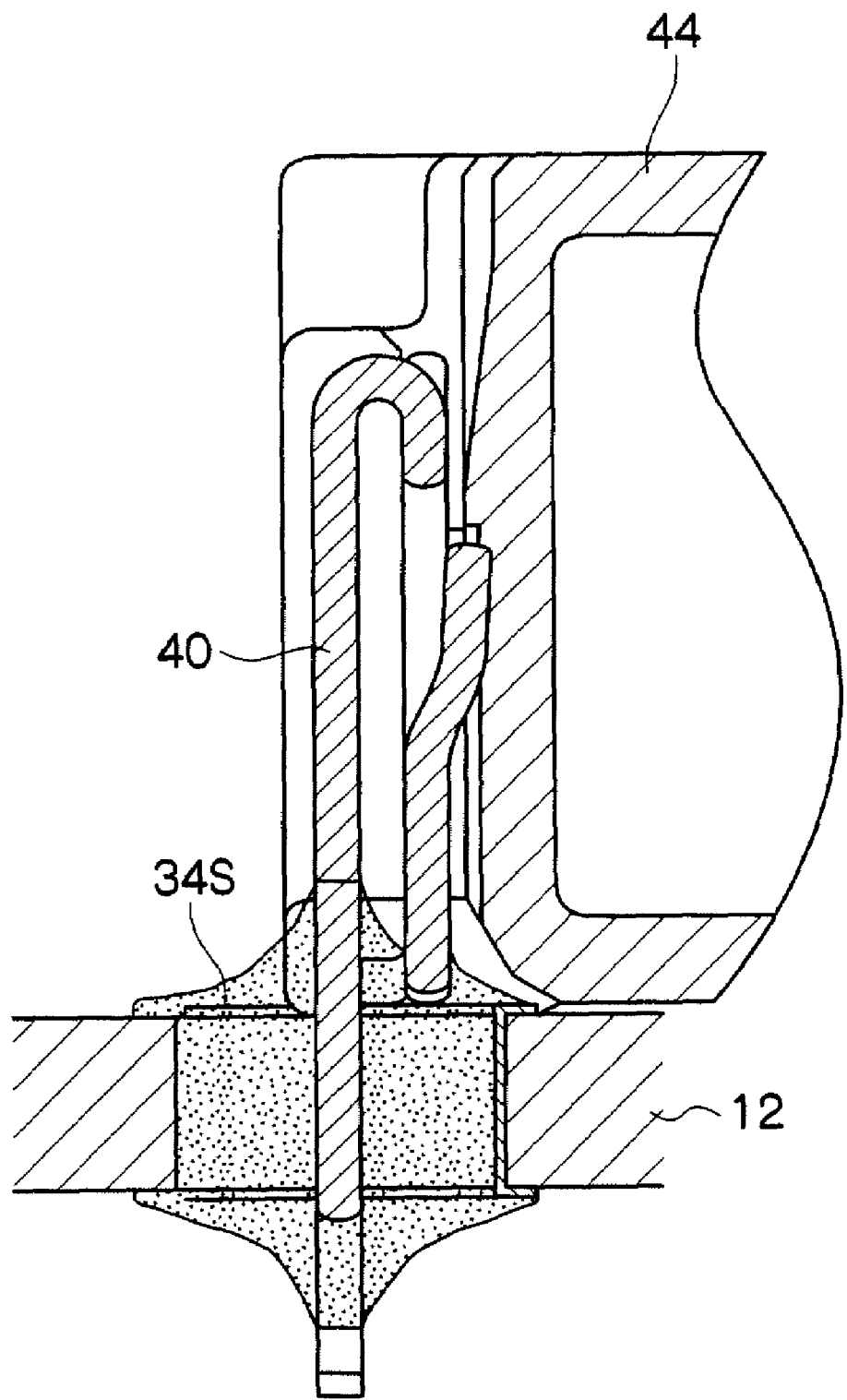
FIG. 6 shows a state in which soldering has been carried out in a variation of the first embodiment.

Further, a fixing member 40 shown in FIGS. 5 and 6 may be used and a contact portion soldering land 34S and a lug portion soldering land 34T adapted to the fixing member 40 may be formed at the printed circuit board 12 so as to fix an electronic component 44 to the printed circuit board 12.

2. Second Embodiment

Secondly, a second embodiment will be described. As shown in FIGS. 7A and 7B, a fixing member 50 according to the present embodiment can be mounted to an electronic component 54 fixed to a printed circuit board 52.

The fixing member 50 has a substantially L-shaped side face and includes an upper portion 56, i.e., a mounting member main body mounted to the electronic component 54 and a lower portion 57, i.e., a contact portion fixed to the printed circuit board 52. When mounted to the electronic component 54 and fixed to the printed circuit board 52, the lower portion 57 of the fixing member 50 is fixed by soldering to the printed circuit board 52 via solder H. A lower portion soldering land for soldering the lower portion 57 is formed on the printed circuit board 52.

Two insertion holes 60 are formed on the printed circuit board 52 and two male connector portions 58 that are to be respectively inserted into the insertion holes 60 are formed on lower portion 57. Each of the two male connector portions 58 comprises a lug portion 59 that is to be engaged with an opening edge 60E of the insertion hole 60 when inserted into the insertion hole 60.

Accordingly, in a fixing structure 70 in which the electronic component 54 is fixed to the printed circuit board 52 using the fixing member 50, the lower portion 57 is fixed by soldering and the male connector portions 58 are engaged with the printed circuit board 52 at their lug portions 59. Therefore, a higher fixing strength compared with conventional techniques can be obtained without increasing size of the fixing member 50. Further, it is possible to suppress bending of the printed circuit board 52 after soldering as compared with conventional techniques.

Although the present embodiments of the present invention have been described above, the above embodiments are examples and can be practiced with various modifications within the scope of the invention without departing from the gist thereof. The scope of the rights of the invention is not limited to the above embodiments.

What is claimed is:

1. A fixing member that can be mounted to a fixed member that is fixed to a printed circuit board and that is used for fixing the fixed member to the printed circuit board, the fixing member comprising:
   a mounting member main body fixed to the fixed member;
   arm-shaped male connector portions having a length greater than a thickness of said printed circuit board and having at tip ends thereof lug portions that are engaged with an opening edge of an insertion opening in the printed circuit board when said male connector portions are inserted completely through the insertion opening; and
   contact portions extending across and beside said male connector portions that contact with a soldering land formed at the printed circuit board and are joined to the soldering land by soldering when the lug portions are engaged with the opening edge,
   wherein the contact portions are formed at the mounting portion main body and the male connector portions extend from the mounting portion main body or from the contact portions, such that solder bonds are formed between the contact portions and said soldering land and said male connector portions when said fixing member is soldered to said printed circuit board; and
   wherein the contact portions are extended at one end of the mounting member main body and the male connector portions are extended at another end of the mounting member main body opposite to the one end and the mounting member main body is folded so that the male connector portions are located between the contact portions.

2. The fixing member of claim 1, wherein the contact portions are formed at one end of the mounting member main body and the male connector portions are located between the contact portions and adjacent the mounting member main body.

3. The fixing member of claim 2, wherein the mounting member main body, the male connector portions, and the contact portions are formed integrally.

4. The fixing member of claim 3, wherein the contact portions are formed by bending one end of the mounting member main body into an orthogonal position with respect to said length of the male connector portions.

5. The fixing member of claim 1, wherein the mounting member main body, the male connector portions, and the contact portions are formed integrally.

6. The fixing member of claim 5, wherein the contact portions are formed by bending one end of the mounting member main body and the male connector portions are formed by bending another end of the mounting portion main body toward the contact portions.

7. A fixing structure comprising:
   the fixing member according to claim 1;
   the fixed member fixed to the mounting member main body provided at the fixing member; and
   the printed circuit board having the insertion opening and the soldering land, the male connector portions of the fixing member being inserted into the insertion opening thereof and contact faces of the fixing member being joined to the soldering land thereof by soldering to thereby fix the fixed member.

8. The fixing structure of claim 7,
   wherein the soldering land of the printed circuit board is a contact portion soldering land disposed around the opening and
   the printed circuit board further includes a lug portion soldering land formed at a side at which the lug portions protrude, the lug portion soldering land being joined to the lug portions by soldering.

* * * * *